United States Patent
Rotay

(10) Patent No.: US 9,917,040 B1
(45) Date of Patent: Mar. 13, 2018

(54) STRESS RELIEVED THERMAL BASE FOR INTEGRATED CIRCUIT PACKAGING

(71) Applicant: STMicroelectronics, Inc., Coppell, TX (US)

(72) Inventor: Craig J. Rotay, Audubon, PA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/375,314

(22) Filed: Dec. 12, 2016

(51) Int. Cl.
*H01L 23/495* (2006.01)
*H01L 23/00* (2006.01)
*H01L 23/31* (2006.01)

(52) U.S. Cl.
CPC .... *H01L 23/49568* (2013.01); *H01L 23/3121* (2013.01); *H01L 23/4952* (2013.01); *H01L 23/49548* (2013.01)

(58) Field of Classification Search
CPC ........... H01L 23/49568; H01L 23/3121; H01L 23/39548; H01L 23/4952; H01L 23/495; H01L 24/85; H01L 24/48; H01L 21/565; H01L 23/4334
USPC ......... 257/676, 669, 712, 713, 77, 721, 787, 257/784, 796, 717
See application file for complete search history.

(56) References Cited

U.S. PATENT DOCUMENTS

| | | | | |
|---|---|---|---|---|
| 5,177,669 A | * | 1/1993 | Juskey | H01L 23/3107 174/16.3 |
| 5,315,155 A | * | 5/1994 | O'Donnelly | H01L 21/52 257/706 |
| 5,604,376 A | * | 2/1997 | Hamburgen | H01L 24/85 257/676 |
| 2008/0258278 A1 | * | 10/2008 | Ramos | H01L 24/36 257/676 |
| 2011/0111562 A1 | * | 5/2011 | San Antonio | H01L 21/4832 438/113 |
| 2011/0175136 A1 | * | 7/2011 | Lin | H01L 21/486 257/99 |
| 2011/0186426 A1 | * | 8/2011 | Hawrylchak | C23C 14/564 204/298.11 |
| 2011/0201157 A1 | * | 8/2011 | Lin | H01L 21/486 438/118 |
| 2014/0077349 A1 | * | 3/2014 | Higgins, III | H01L 21/565 257/692 |
| 2015/0028437 A1 | * | 1/2015 | Fell | B81B 7/0048 257/417 |
| 2015/0181697 A1 | * | 6/2015 | Goida | H01L 21/78 361/728 |

(Continued)

*Primary Examiner* — Alexander Oscar Williams
(74) *Attorney, Agent, or Firm* — Gardere Wynne Sewell LLP

(57) ABSTRACT

A package is formed by a thermal base and a leadframe assembly. The thermal base includes a body of thermally conductive material having a top surface, wherein the top surface of the body includes a pedestal. An integrated circuit chip is mounted to the pedestal, the integrated circuit chip including bonding pads. The leadframe assembly includes leads and an encapsulant ring that partially embeds the leads. The leadframe assembly is mounted to the top surface of said body surrounding the pedestal. The pedestal is configured with a thickness that positions the bonding pad at a height substantially coplanar with the leads. Bonding wires extend from the bonding pads to the leads with a shortened length so as to provide for improved electrical characteristics of frequency response, impedance and inductance.

20 Claims, 15 Drawing Sheets

(56) References Cited

U.S. PATENT DOCUMENTS

2017/0162422 A1* 6/2017 Raj .................. H01L 21/68721

* cited by examiner

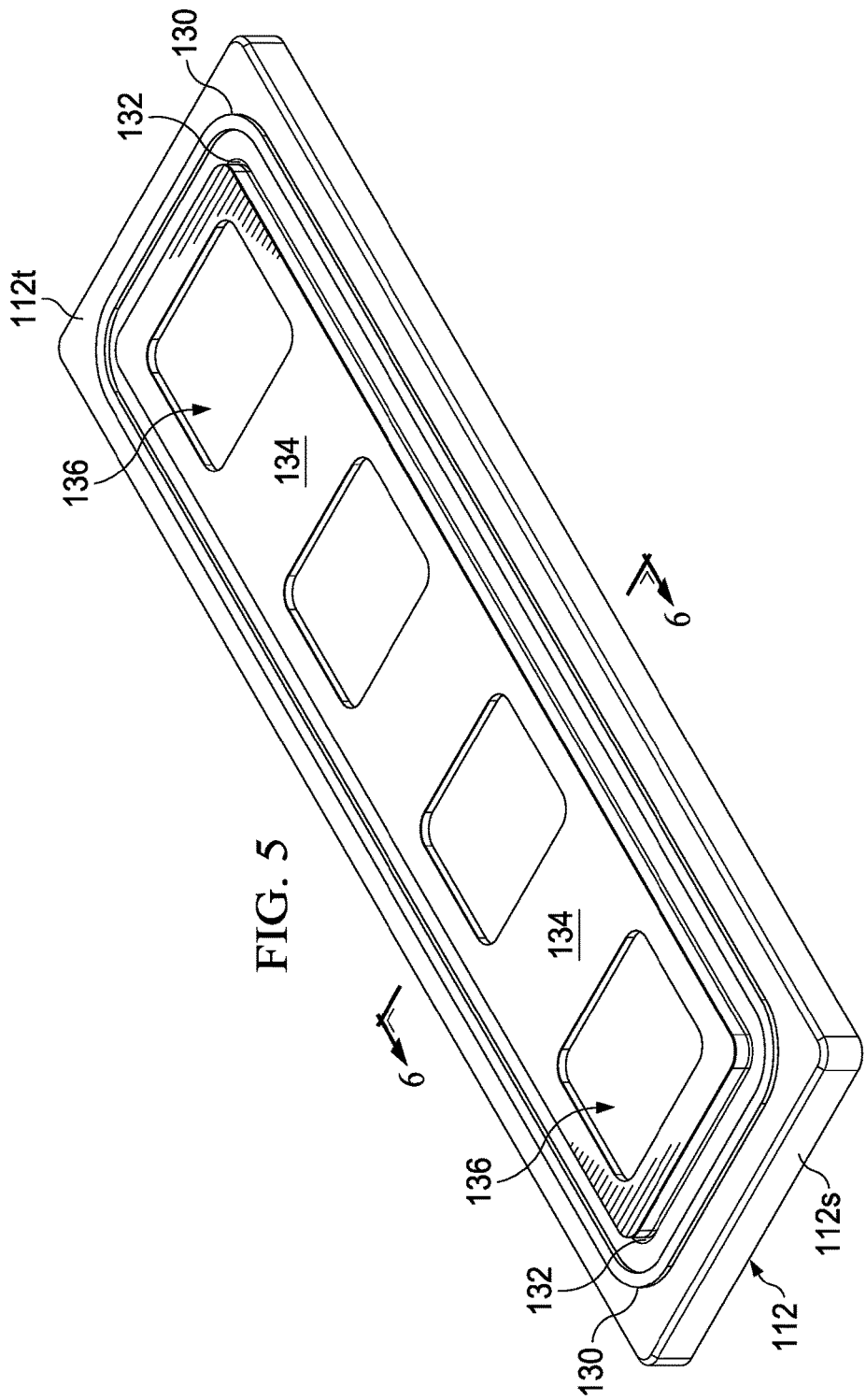

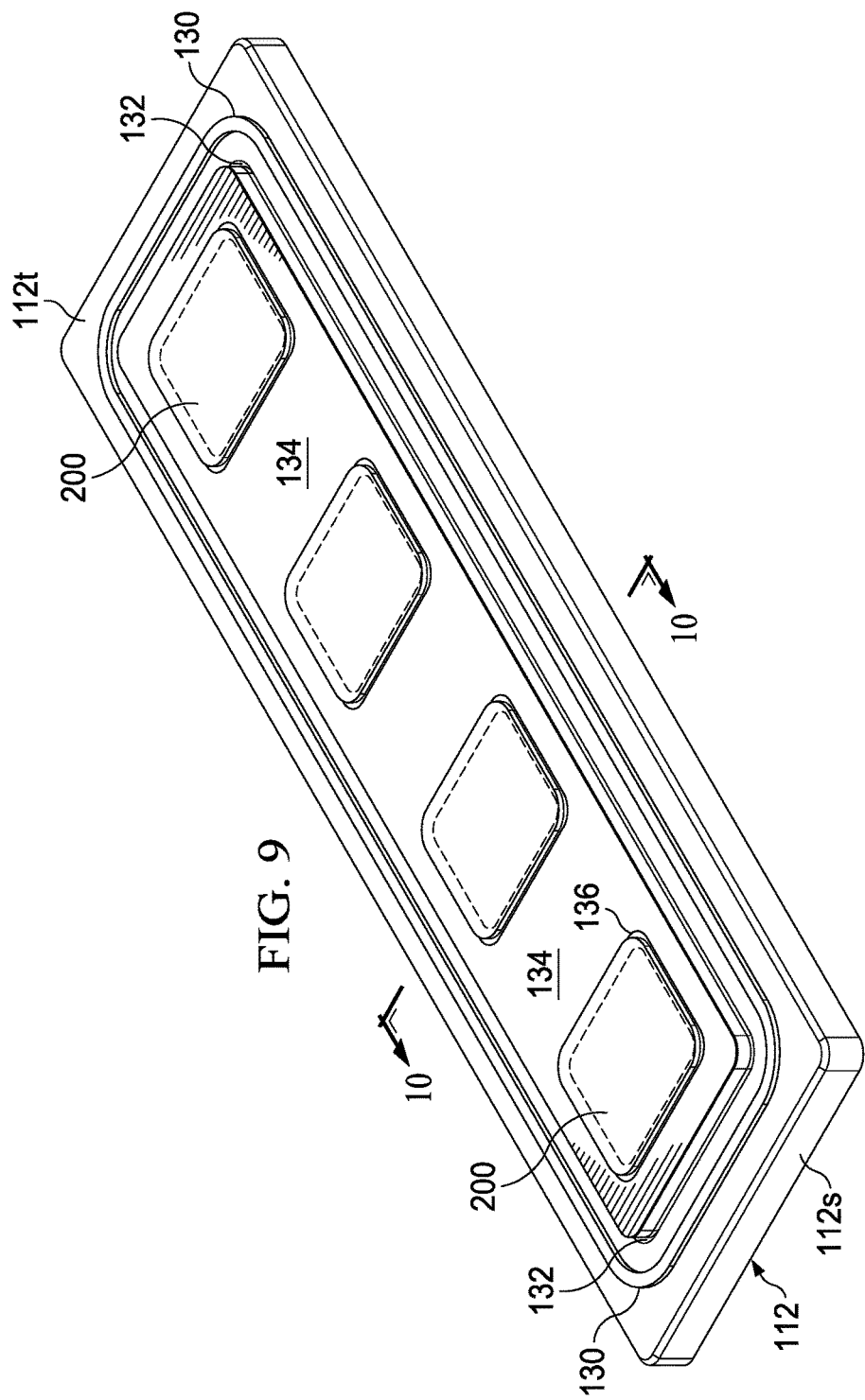

US 9,917,040 B1

STRESS RELIEVED THERMAL BASE FOR INTEGRATED CIRCUIT PACKAGING

TECHNICAL FIELD

The present invention relates to integrated circuit packaging.

BACKGROUND

The components of an integrated circuit package are often made of a variety of materials. It is commonplace to mount an integrated circuit die to a die pad of a leadframe or base assembly. It is also known to include in the package a base or base assembly element functioning as a thermal dissipater, such as a heat sink. The use of different materials for the package components is a necessity given the different functions performed, but this can present a concern where different coefficients of thermal expansion (CTE) exist and mechanical stress is introduced. Failure of the package may result. There is a need in the art to design the package and choose materials that mitigate the buildup of mechanical stresses while maintaining or improving upon electrical performances and ruggedness as to environmental factors.

SUMMARY

In an embodiment, a thermal base comprises: a body of thermally conductive material having a top surface; wherein the top surface of said body includes: a rib; a first recess; and a pedestal.

In an embodiment, a package comprises a thermal base and a leadframe assembly. The thermal base includes: a body of thermally conductive material having a top surface, wherein the top surface of said body includes a pedestal with an integrated circuit chip mounted to said pedestal, said integrated circuit chip including a bonding pad. The leadframe assembly includes: a plurality of the leads; and an encapsulant ring that partially embeds said plurality of leads. The leadframe assembly is mounted to the top surface of said body surrounding the pedestal, and the pedestal has a thickness that positions the bonding pad at a height substantially coplanar with the plurality of leads.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings:

FIG. 5 is a perspective view of the thermal base having an alternative configuration;

FIG. 9 is a perspective view of the thermal base with an attached integrated circuit die;

DETAILED DESCRIPTION

Figure 1A:
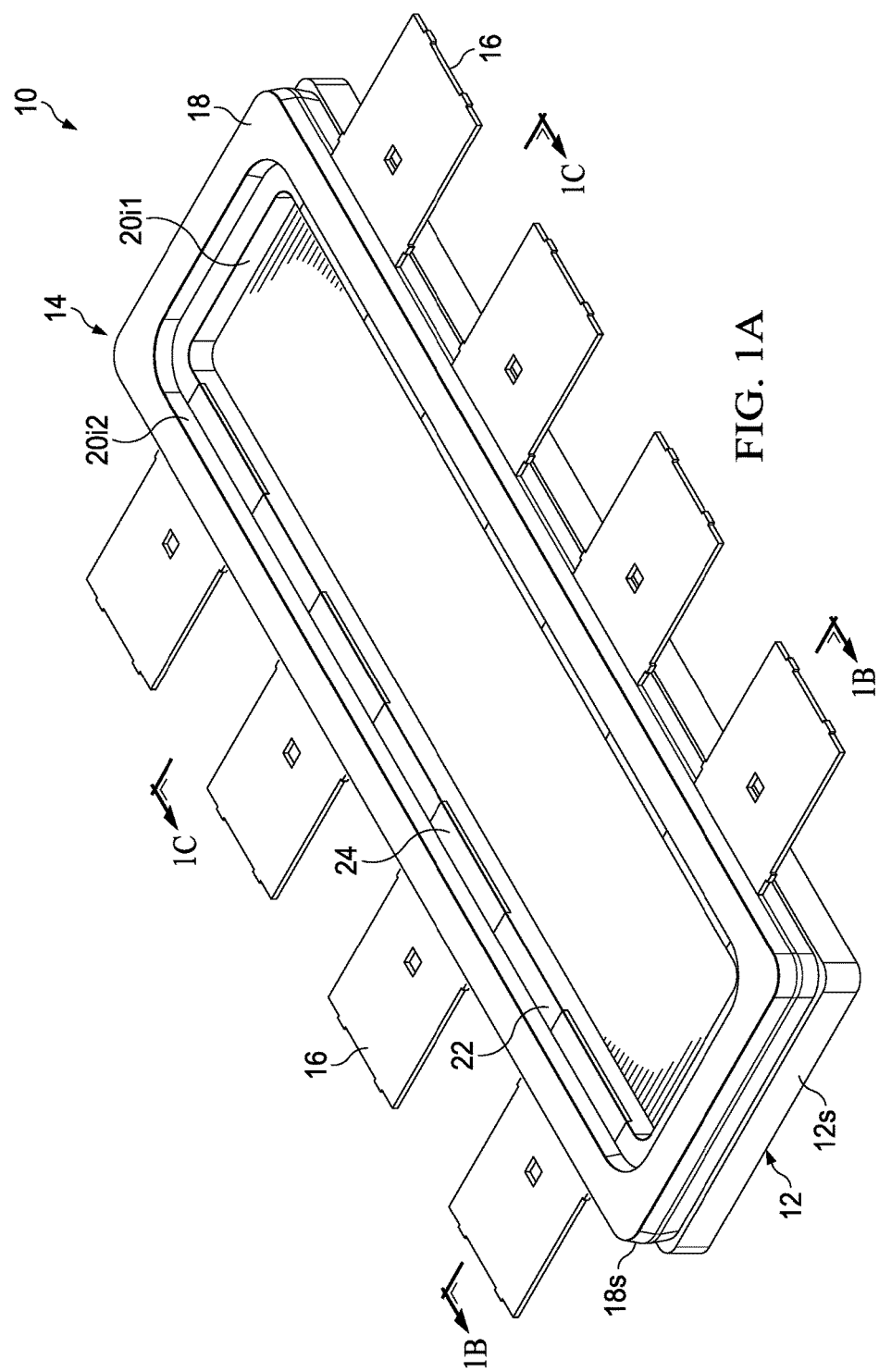
FIG. 1A is a perspective view of a portion of an integrated circuit package.
Figure 1B:
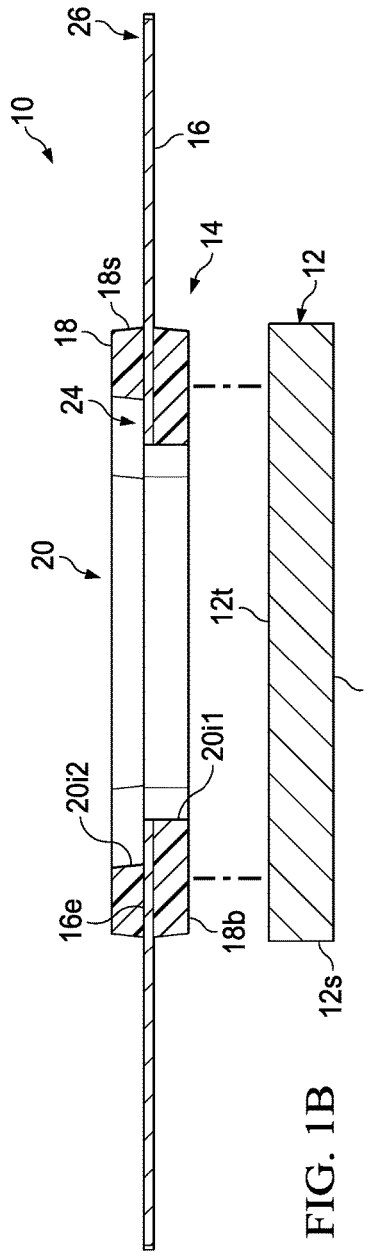
FIGS. 1B, 1C and 1D are cross-sectional views of the integrated circuit package of FIG. 1A.
Figure 1C:
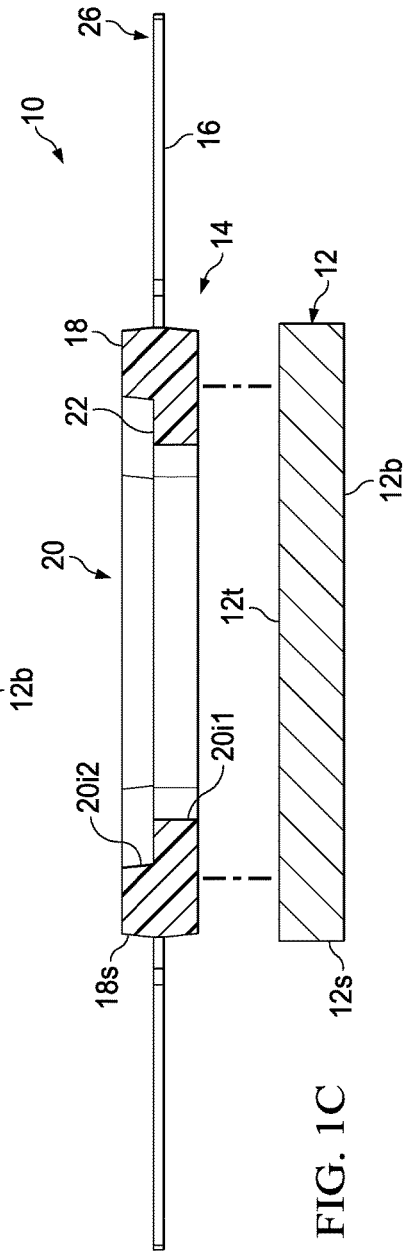
Figure 1D:
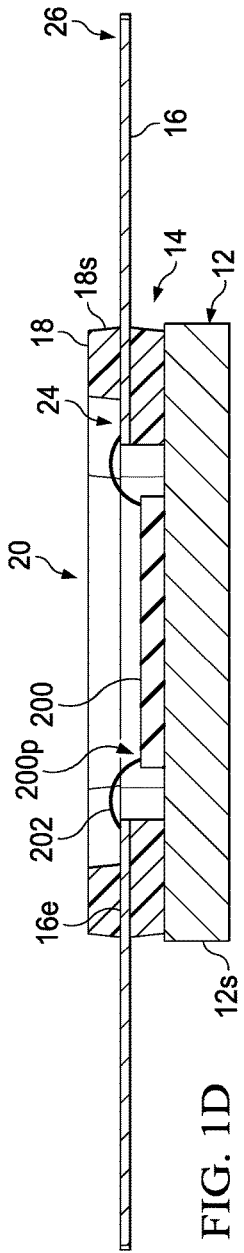

Reference is now made to FIGS. 1A-1D. An embodiment of a portion 10 of an integrated circuit package is shown. The portion 10 includes thermal base 12 and a leadframe assembly 14. The thermal base 12 is a block (or body) of thermally conductive material (for example, made of copper, but use of other thermally conductive materials is also possible depending on application). In plan view, the thermal base 12 presents a rectangular shape defined by side edges or walls 12s. The side edges 12s extend between a top surface 12t and a bottom surface 12b. In the illustrated embodiment, the top and bottom surfaces are planar. The leadframe assembly 14 is formed of two components: a plurality of the leads 16 and an encapsulant ring 18. The leads 16 are made of an electrically conductive metal material and the ring 18 is made of an encapsulating material such as a cured resin or epoxy. The encapsulating material may be formulated for various levels of thermal performance and environmental ruggedness. The body of the encapsulant ring 18 surrounds an open region 20 and embeds a portion 16e of each lead 16 (see, FIG. 1B). The open region 20 defines a ledge 22 and a proximal end 24 of each lead 16 is exposed within the open region 20 at the ledge 22 (see, FIG. 1B). The open region is further defined by an inner side edge or wall 20i1 below the ledge 22 and an inner side edge or wall 20i2 above the ledge 22. A bottom surface 18b of the encapsulant ring 18 is mounted to the top surface 12t of the thermal base 12. An integrated circuit die 200 (as shown in FIG. 1D) is mounted to the top surface of the thermal base 12 within the open region 20 and surrounded by the inner side edge 20i1. Bonding wires 202 (FIG. 1D) are provided to electrically connect pads 200p of the integrated circuit die to the proximal ends 24 of the leads 16. The distal ends 26 of the leads 16 extend away from the outer perimeter side wall or edge 18s of the encapsulant ring 18.

In the configuration of FIGS. 1A-1D, it will be noted that a top surface of the integrated circuit die 200 where the pads 200p are located is vertically offset from a top surface of the proximal ends 24 of the leads 16 at the ledge 22. This vertical offset affects the lengths of the bonding wires 202 and the bonding wire length is factor in the electrical characteristics of frequency response, impedance and inductance.

Reference is now made to FIGS. 2A-2D. An embodiment of a portion 110 of an integrated circuit package is shown. The portion 110 includes a thermal base 112 and a leadframe assembly 114. The thermal base 112 is a block of thermally conductive material (for example, made of copper, but use of other thermally conductive materials is also possible depending on application). In a plan view, the thermal base 112 presents a rectangular shape defined by side edges or walls 112s. The side edges 112s extend between a top surface 112*t* and a bottom surface 112*b*. In the illustrated embodiment, the bottom surface 112*b* is planar. The top surface 112*t*, however, includes a plurality of structural features. A first structural feature on the top surface 112*t* of the thermal base 112 is a rib 130 (see, for example, FIGS. 2B-2C). A second structural feature on the top surface 112*t* of the thermal base 112 is a recess 132 (see, for example, FIGS. 2B-2C). A third structural feature on the top surface 112*t* of the thermal base 112 is a pedestal 134 (see, for example, FIGS. 2B-2C).

Figure 3:
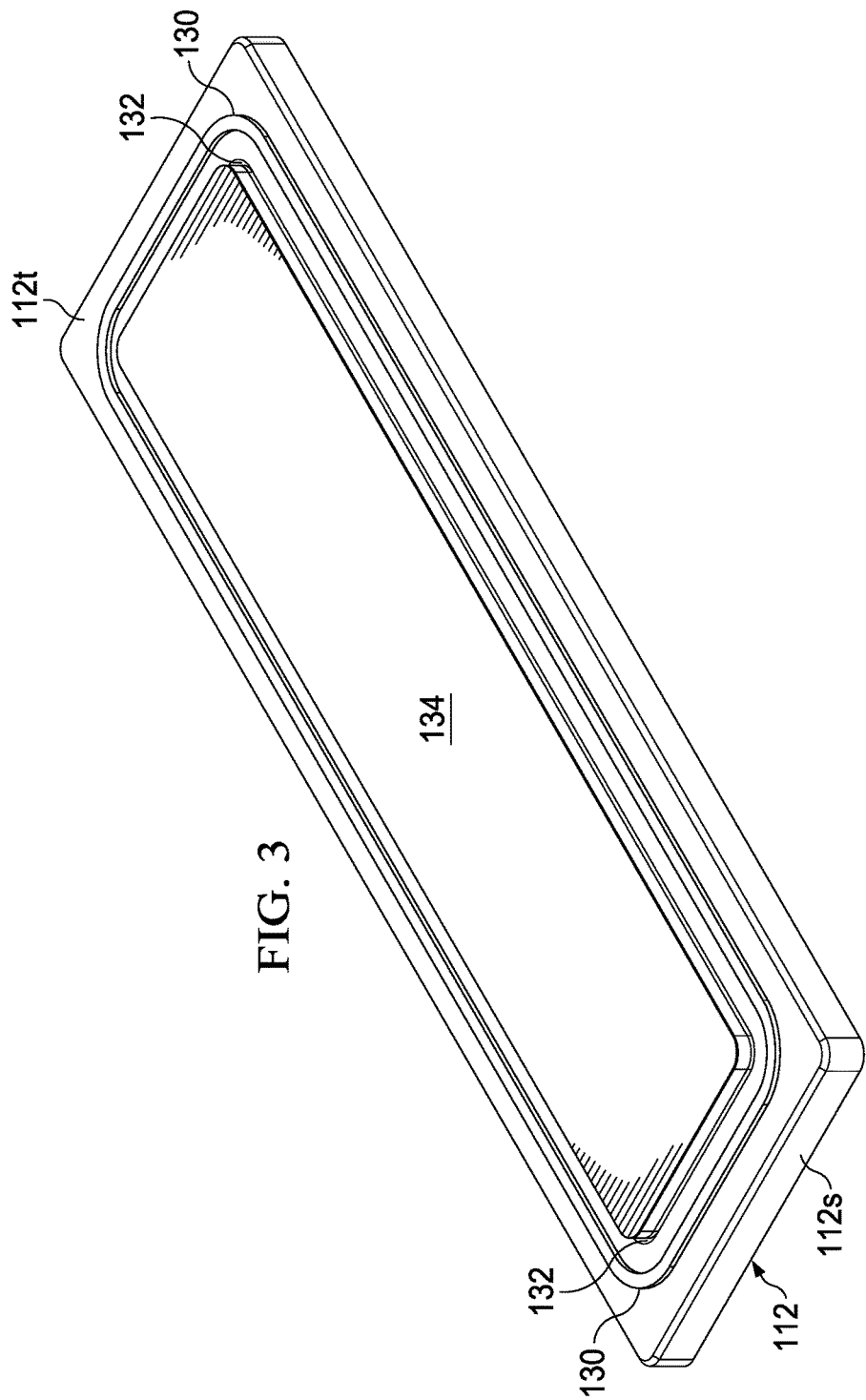
FIG. 3 is a perspective view of the thermal base.

FIG. 3 shows a perspective view of one embodiment for the thermal base 112. The pedestal 134 includes a top surface and a peripheral side wall. The recess 132 encircles the pedestal 134 and is located adjacent to the peripheral side wall of the pedestal 134. The rib 130 encircles the pedestal 134 and recess 132, but is offset therefrom.

The leadframe assembly 114 is formed of two components: a plurality of the leads 116 and an encapsulant ring 118. The leads 116 are made of an electrically conductive metal material and the ring is 118 made of an encapsulating material such as a cured resin or epoxy. The encapsulating material may be formulated for various levels of thermal performance and environmental ruggedness. The body of the encapsulant ring 118 surrounds an open region 120 and embeds a portion 116*e* of each lead 116 (see, FIG. 2B). The open region 120 defines a ledge 122 and a proximal end 124 of each lead 116 is exposed within the open region 120 at the ledge 122. The open region is further defined by an inner side edge or wall 120*i*1 below the ledge 122 and an inner side edge or wall 120*i*2 above the ledge 122.

Figure 2A:
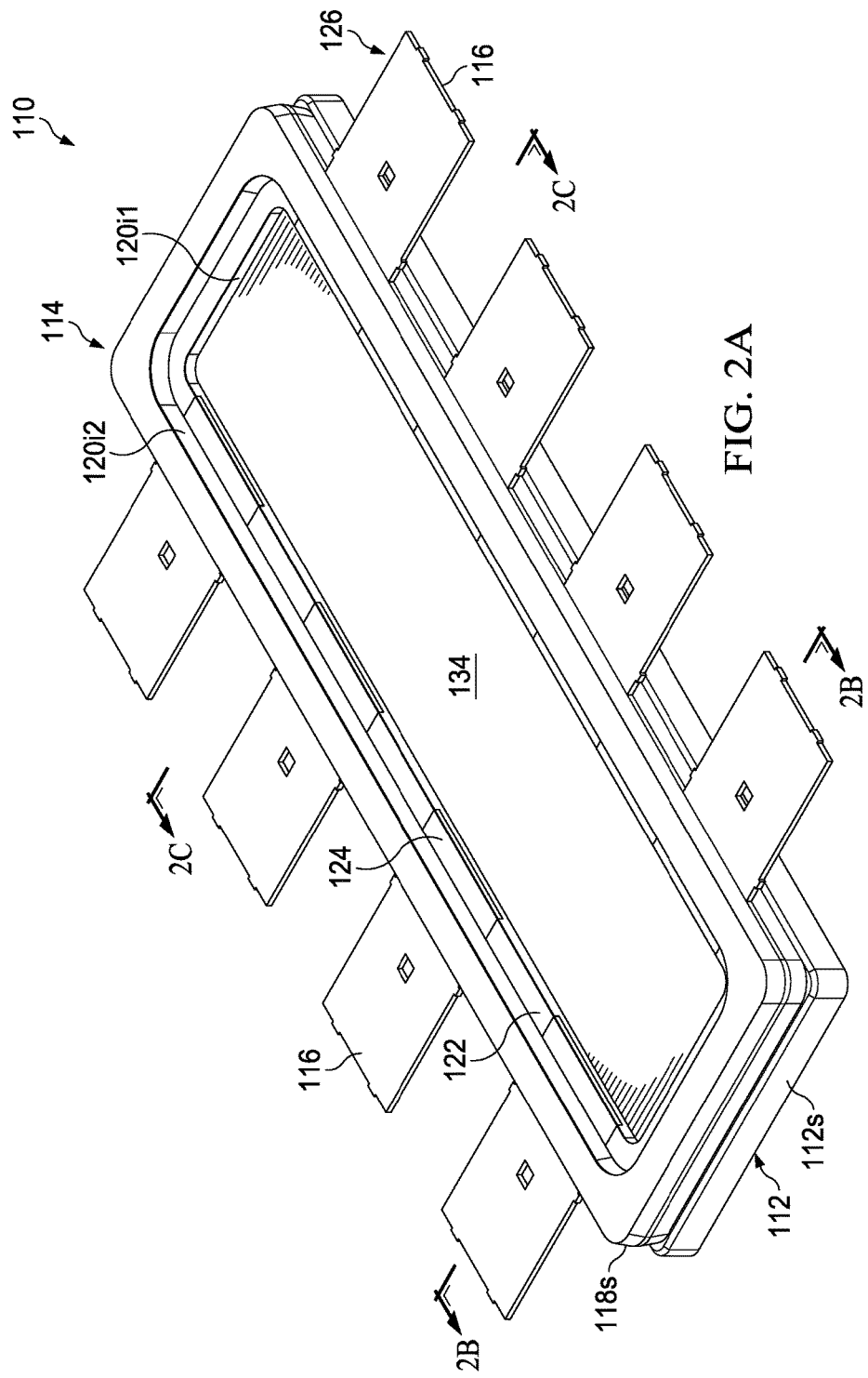
FIG. 2A is a perspective view of a portion of an integrated circuit package.
Figure 2B:
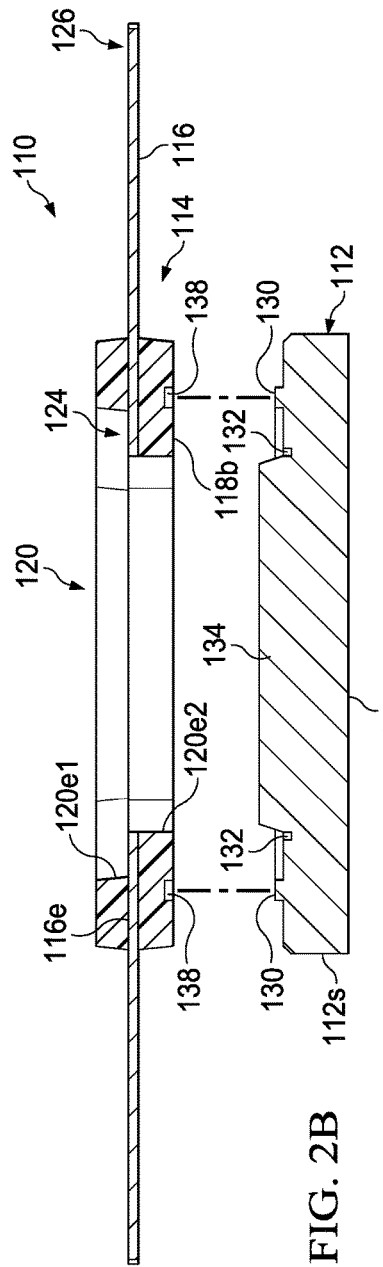
FIGS. 2B, 2C and 2D are cross-sectional views of the integrated circuit package of FIG. 2A.
Figure 2C:
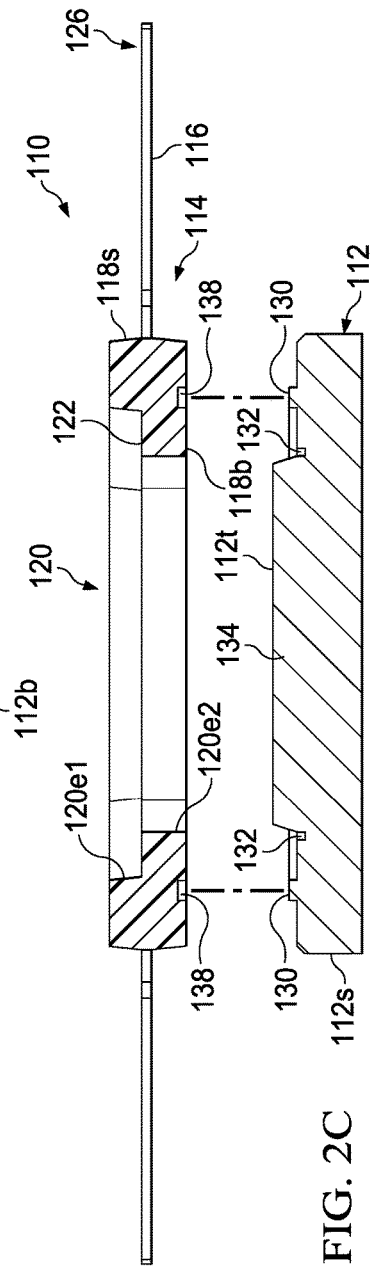
Figure 2D:
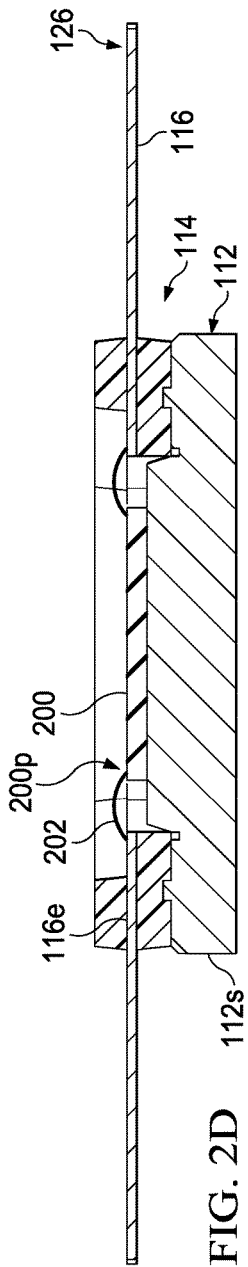

A bottom surface 118*b* of the encapsulant ring 118 is mounted to the top surface 112*t* of the thermal base 112 (see, FIG. 2D). The bottom surface 118*b* of the encapsulant ring 118 includes a recess 138 that is sized and shaped to mate with the rib 130 of the thermal base 114 (see, FIGS. 2B-2D). The rib 130 and recess 138 accordingly function as an adhesion promoter. The heights of these structures are designed to make the thickness of the bonding line independent of the process pressure applied to join the leadframe assembly 114 to the thermal base 112.

An integrated circuit die 200 (FIG. 2D) is mounted to the upper surface of the pedestal 134 of the thermal base 112 within the open region 120 and surrounded by the inner side edge 120*i*1. Bonding wires 202 (FIG. 2D) are provided to electrically connect pads 220*p* of the integrated circuit die 200 to the proximal ends 124 of the leads 116. The distal ends 126 of the leads 116 extend away from the outer perimeter side wall or edge 118*s* of the encapsulant ring 118.

In the configuration of FIGS. 2A-2D, it will be noted that a top surface of the integrated circuit die 200 where the pads 200*p* are located is substantially coplanar (±1-5%) to a top surface of the proximal ends 124 of the leads 116 at the ledge 122. This substantially coplanar surface configuration advantageously affects the lengths of the bonding wires 202. In comparison to the configuration of FIGS. 1A-1D, it will be noted that bonding wire length is shorter, and this has a beneficial effect on the electrical characteristics of frequency response, impedance and inductance. Indeed, there is a substantial reduction in bonding wire inductance in comparison to FIGS. 1A-1D, and improvement in frequency response, and better impedance matching.

Figure 4A:
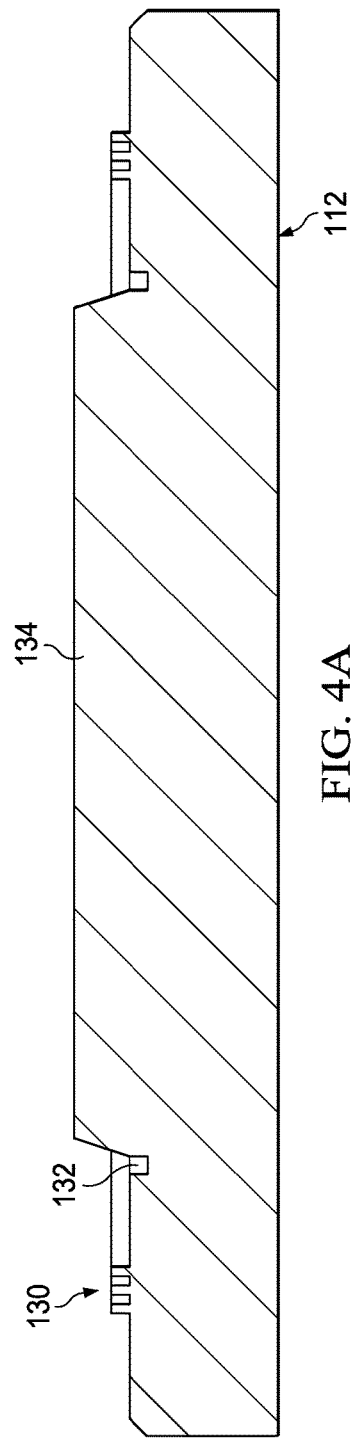
FIGS. 4A-4B shown cross-sectional views of the thermal base.
Figure 4B:
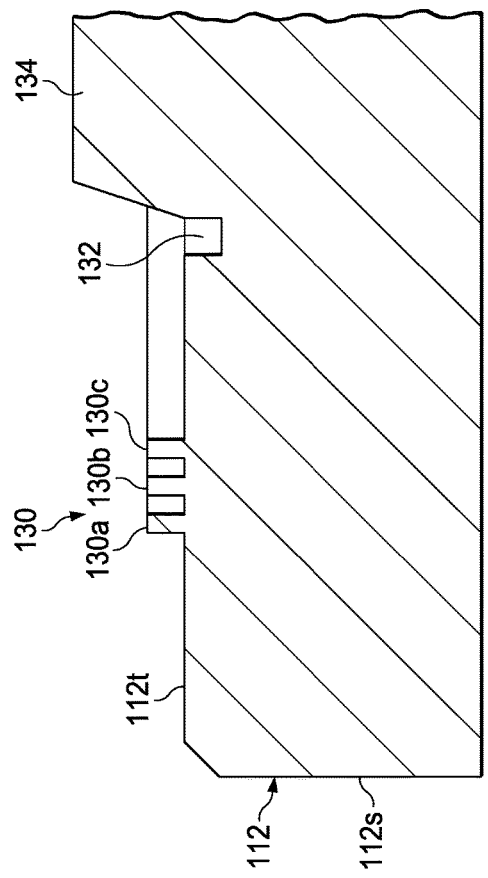
Figure 4C:
FIGS. 4C-4D show plan views of a rib feature.
Figure 4D:
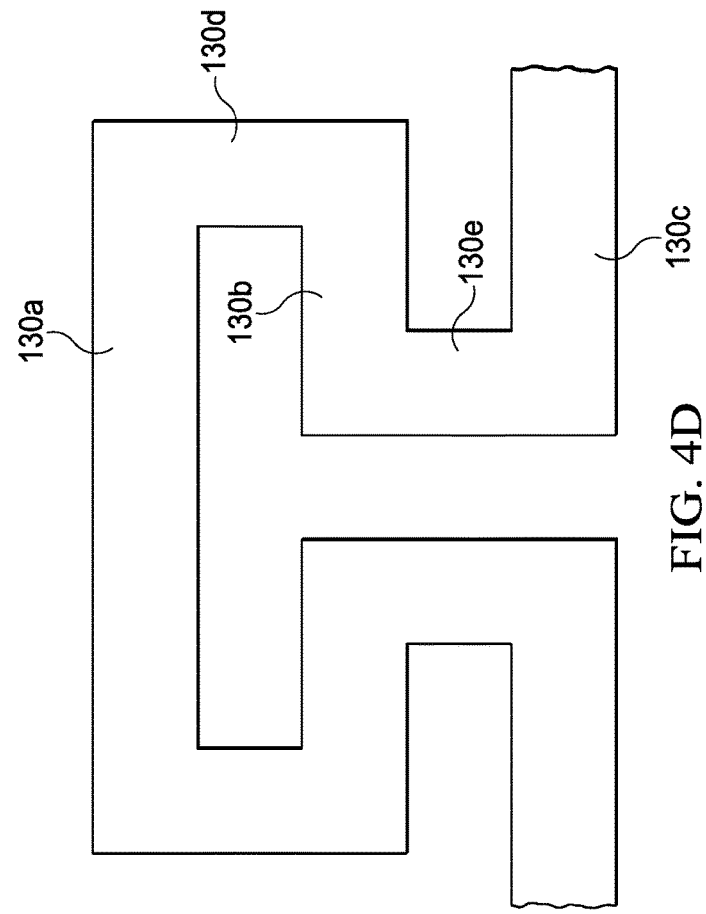

FIG. 4A shows a cross-sectional view of an embodiment of the thermal base 112. A detailed cross-sectional view of a portion of the thermal base adjacent a side edge is shown in FIG. 4B. FIGS. 4C-4D show a plan view of the rib 130 as having a serpentine shape formed by segments 130*a*, 130*b*, 130*c*, 130*d* and 130*e*. This serpentine shape increases mean path length to provide a more secure seal in comparison to the linear ring embodiment for the rib 130 shown in FIG. 3.

Figure 6:
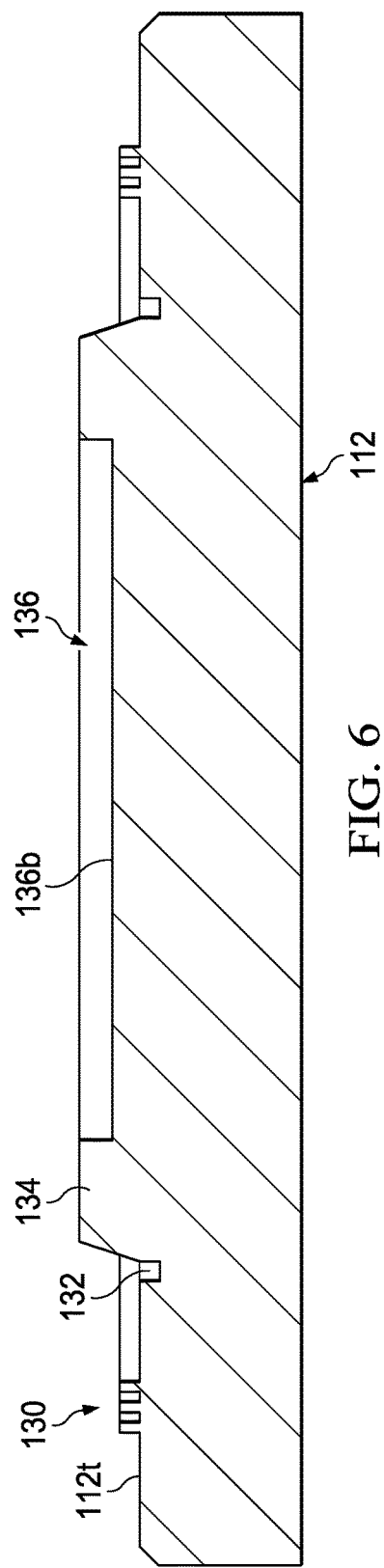
FIG. 6 is a cross-sectional view of FIG. 5.

Reference is now made to FIG. 5 showing a perspective view of the thermal base 112 having an alternative configuration. In this configuration, the pedestal 134 includes a plurality of additional recesses 136. A cross-sectional view of this alternative configuration for the thermal base 112 is shown in FIG. 6. The recesses 136 have a depth which is less than a thickness of the pedestal 134 extending from the upper surface of the base 112. The recesses 136 may, for example, be sized and shaped in plan view to each receive an integrated circuit die 200 (not shown). A bottom surface of the received integrated circuit die 200 in such an installation may be mounted by an adhesive directly to the bottom surface 136*b* of the recess 136.

In this alternative configuration, the thickness of the pedestal 134 and depth of the recess 136 are selected such that the upper surface of the die 200, when installed within the recess 136, will be substantially coplanar (±1-5%) to a top surface of the proximal ends 124 of the leads 116 at the ledge 122 as discussed above.

Figure 7:
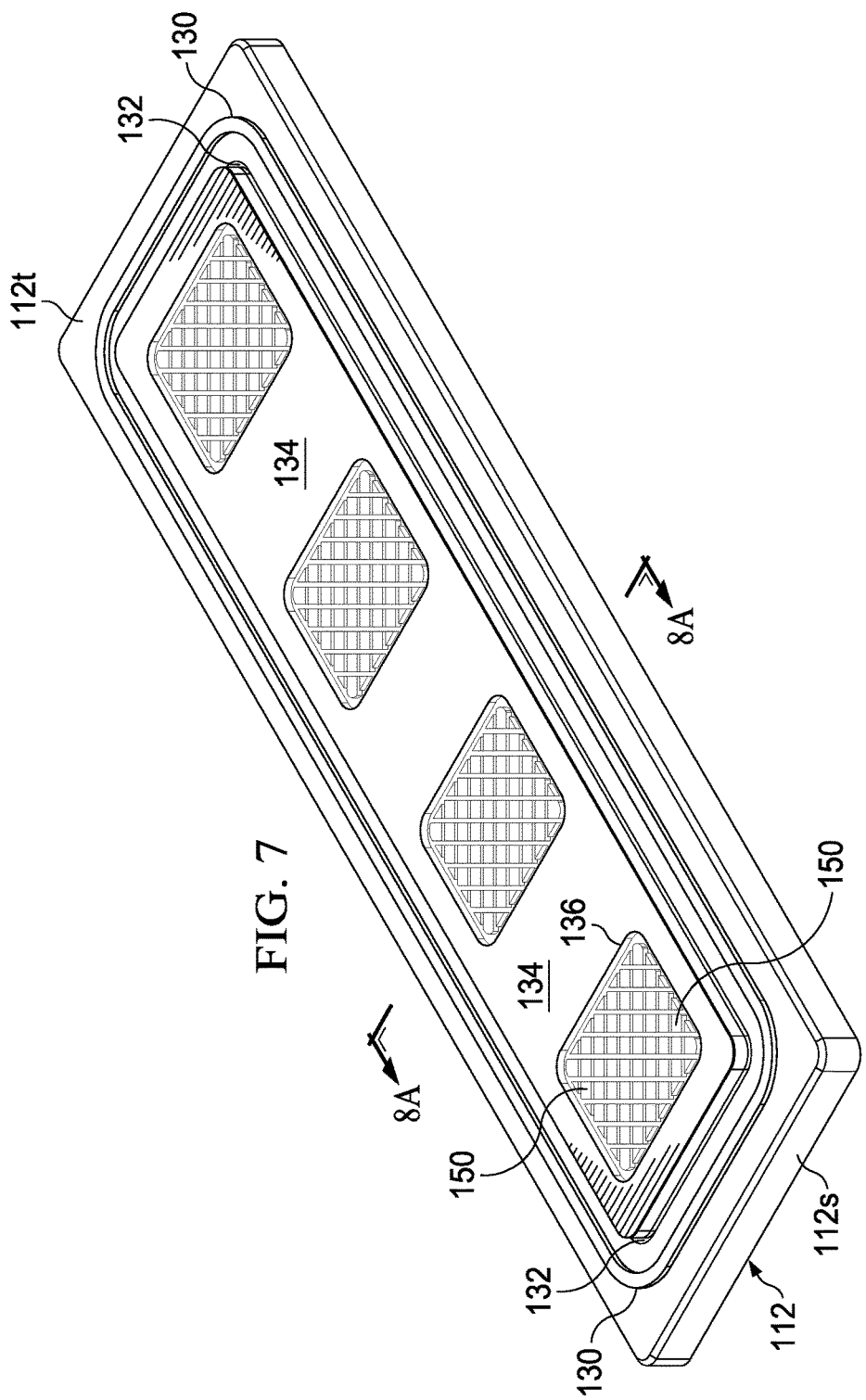
FIG. 7 is a perspective view of the thermal base having an alternative configuration.
Figure 8A:
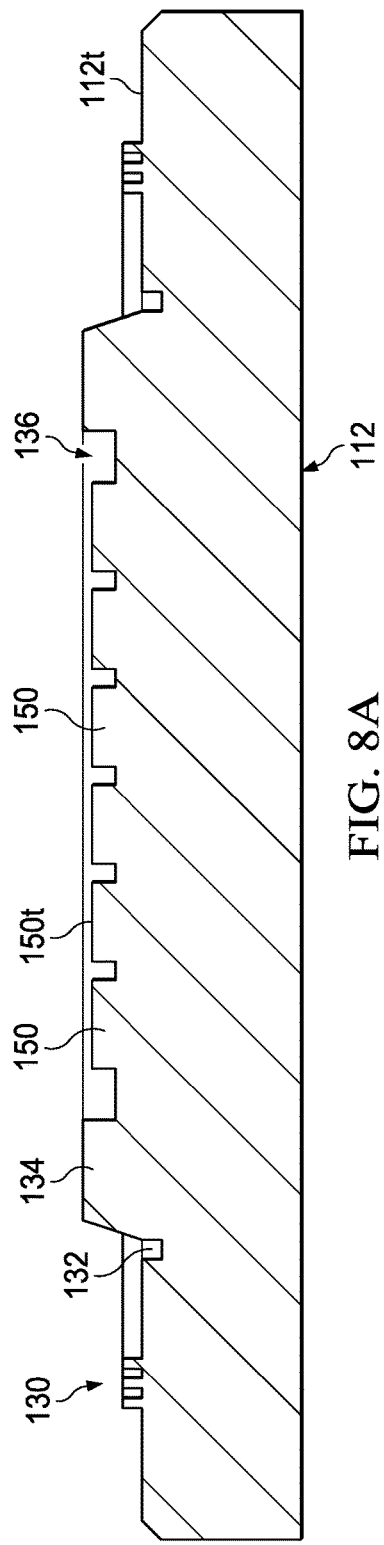
FIG. 8A is a cross-sectional view of FIG. 7.
Figure 8B:
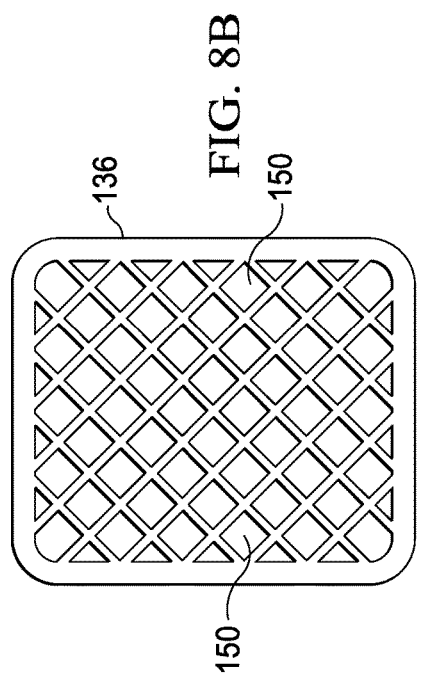
FIG. 8B is a plan view of a recess including sub-pedestal structures.

Reference is now made to FIG. 7 showing a perspective view of the thermal base 112 having a further alternative configuration. In this further alternative configuration, each of the recesses 136 includes one or more sub-pedestal structures 150. FIG. 8A shows a cross-sectional view and FIG. 8B shows a plan view. Again, the recesses 136 may, for example, be sized and shaped in plan view to each receive an integrated circuit die 200 (not shown). A bottom surface of the received integrated circuit die in this implementation is mounted to the top surfaces 150*t* of the sub-pedestal structures 150. The plurality of sub-pedestal structures 150 may arranged in a pattern. FIG. 8B, for example, shows an arrayed or waffle pattern. The pattern functions as an adhesion promotor.

In this alternative configuration, the thickness of the pedestal 134, the depth of the recess 136 and the thicknesses of the sub-pedestal structures 150 are selected such that the upper surface of the die 200, when installed within the recess 136 on top of the sub-pedestal structures 150, will be substantially coplanar (±1-5%) to a top surface of the proximal ends 124 of the leads 116 at the ledge 122 as discussed above. See, FIG. 12.

Figure 10:
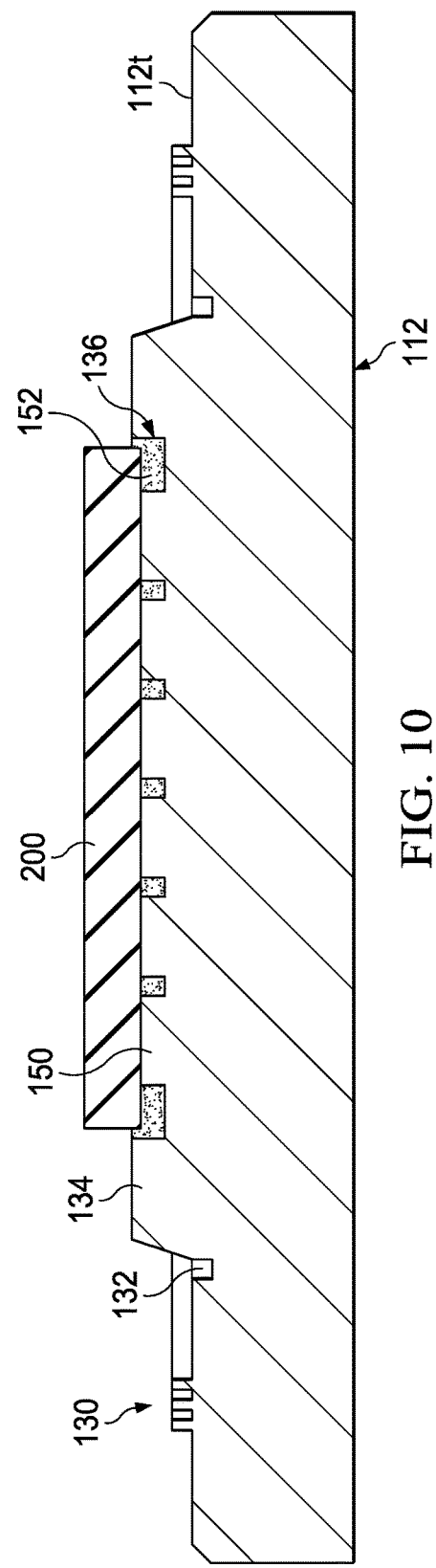
FIG. 10 is a cross-sectional view of FIG. 9.

FIG. 9 shows the mounting of an integrated circuit die 200 to the sub-pedestal structures 150 within each recess 136. FIG. 10 shows a cross-sectional view. An adhesive material 152 may be used to attach the die 200. The adhesive material fills the gaps between individual ones of the sub-pedestal structures 150 and secures the bottom surface of the die 200.

Figure 11:
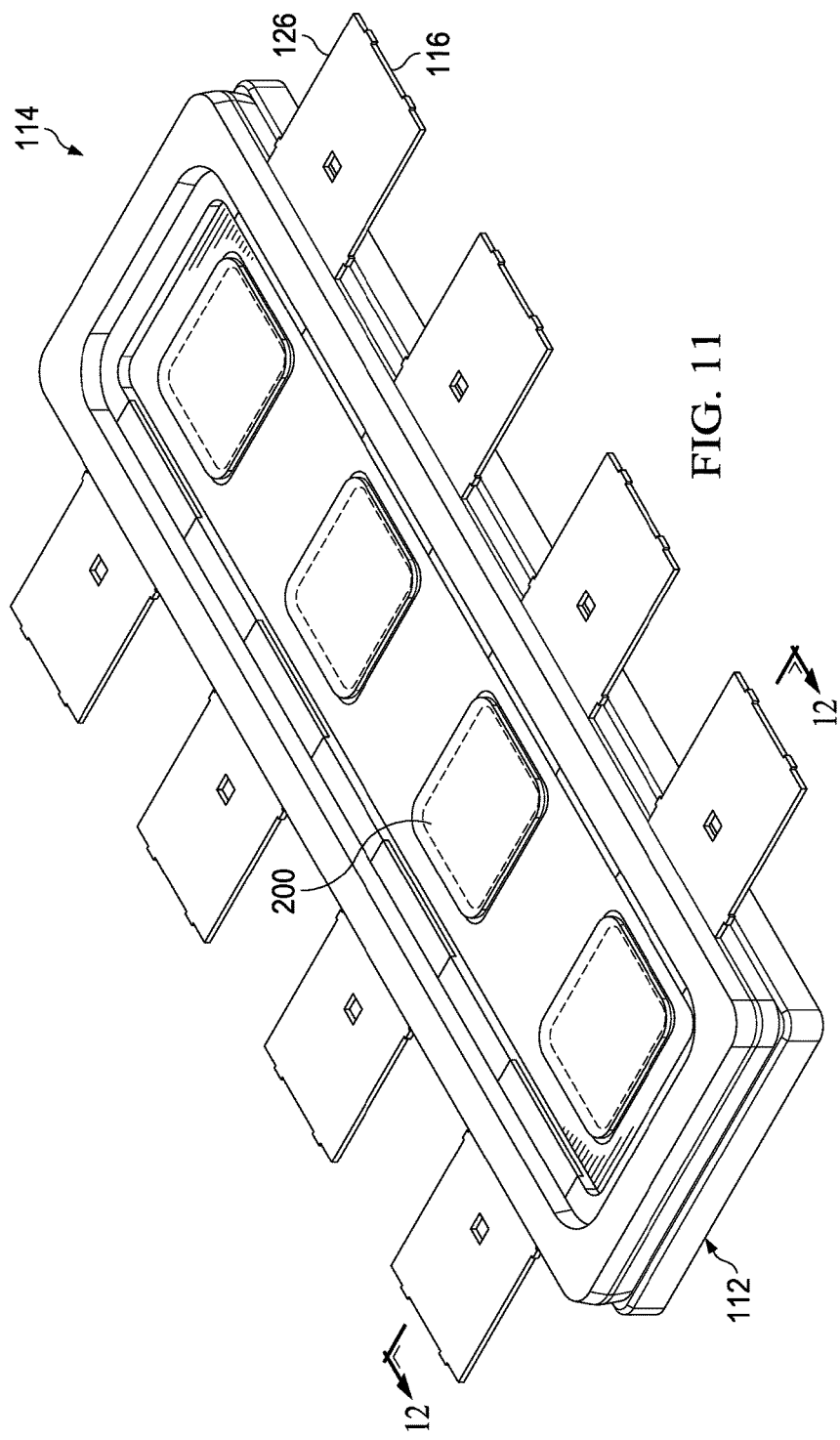
FIG. 11 is a perspective view of a portion of an integrated circuit package including the thermal base of FIGS. 7 and 9.
Figure 12:
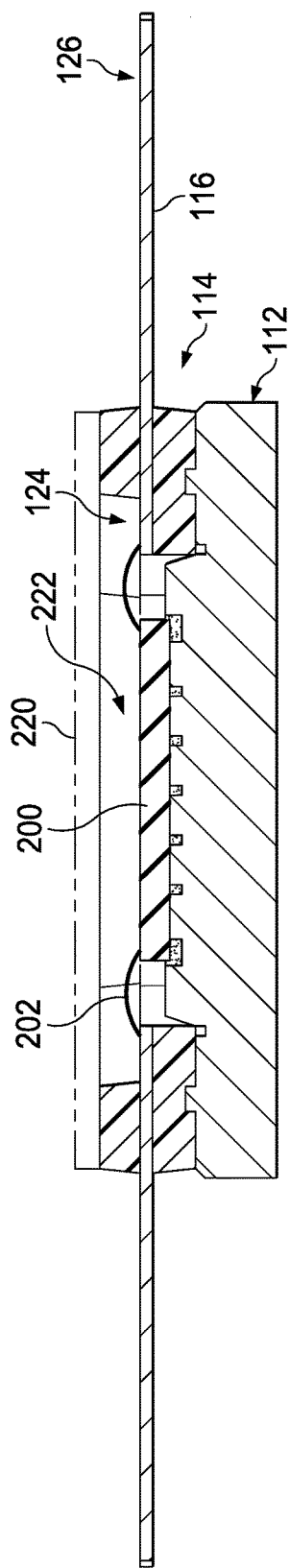
FIG. 12 is a cross-sectional view of FIG. 11.

FIG. 11 shows the leadframe assembly 114 mounted to the thermal base 112. FIG. 12 shows a cross-section through a portion of FIG. 11. Bonding wires 202 are provided to electrically connect pads of the integrated circuit die 200 to the proximal ends 124 of the leads 116. The distal ends 126 of the leads 116 extend away from the outer perimeter of the encapsulant ring 118.

The rib 130 and recess 132 provide a strategic geometry that assists in locating the leadframe assembly 114 during attachment to the thermal base 112. These structures assist in improving adhesion between the leadframe assembly and the thermal base, decrease process variation (sensitivity to applied pressure) and increase the path length which resists moisture ingress from outside of the package to inside of the package.

The pedestal 134 provides a raised platform supporting the die. The design of the pedestal is based on the inside dimensions of the opening in the leadframe assembly. The height of the pedestal is chosen to closely coincide with the plane of the top surface of the leads of the leadframe assembly. The side walls of the pedestal have a draft angle that assists in locating the leadframe assembly in relation to the thermal base while still providing electrical clearance between the leadframe assembly, the die mounted to the thermal base and the bonding wires.

The additional recesses 136 provide a cavity that is designed to be of compatible outside dimension with the die 200 to be attached. This recess 136 can be used to accurately locate the adhesive bonding material for die attach.

The sub-pedestal structures 150 provide an additional loft structure designed with an outer dimension slightly smaller than the die dimension. The height of the sub-pedestal structures 150 is provided to return the die top surface to a level that closely coincides (±1-5%) with the plane of the leads of the leadframe assembly. This feature helps with accurate placement of the die and relieves the stress around the perimeter of the die when attached. The stress developed between materials with incompatible CTE can be managed by designing this feature to be slightly smaller than the die so that the peripheral edges of the die overhang the sub-pedestal structures 150 slightly.

The die may, for example, comprise semiconductor high power transistor device.

A cover (reference 220 shown schematically in FIG. 12) may be attached to the top of the leadframe assembly 114 so as to enclose the open region 120. With this configuration, the open region 120 forms an air cavity 222. This air cavity is important in some applications, such as with an integrated circuit die 200 implementing a high frequency transistor, because the bonding wires 202 pass through the air cavity 222 and the permittivity (dielectric constant) of air is 1. This presents an advantage over other packaging techniques for high frequency transistor integrated circuits where the bonding wires are encapsulated by a resin having a higher dielectric constant resulting comparatively in a degraded high frequency performance.

It will also be noted that the cavity 222 defined by the open region 120 is useful to constrain the flow of any protective dielectric gel that is dispensed on and over the die 200.

In a sealed configuration, the rib, recess and pedestal structures create a longer moisture path length between the outside of the sealed package and the open region where the electrical surfaces of the die and the wirebonds are located. This improves the ruggedness of the package by providing enhanced protection from the outside environment and reduced sensitivity to moisture.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A thermal base, comprising:
   a body of thermally conductive material configured to support an integrated circuit die and having a top surface;
   wherein the top surface of said body includes:
      a pedestal extending in a first direction;
      a rib extending in the first direction and surrounding the pedestal;
      a first recess extending in a second direction opposite the first direction and surrounding the pedestal; and
      wherein the pedestal, the rib, and the first recess are features of a same unitary body.

2. The thermal base of claim 1, further comprising a second recess in a top surface of the pedestal.

3. The thermal base of claim 2, further comprising a plurality of sub-pedestal structures within the second recess.

4. The thermal base of claim 3, wherein the second recess is sized and shaped to receive the integrated circuit die having a bottom surface mounted to a top surface of the plurality of sub-pedestal structures.

5. The thermal base of claim 1, wherein the top surface of said body further includes a peripheral surface disposed below a top surface of the pedestal and wherein the first recess extends into the peripheral surface and is disposed proximate a peripheral side wall of the pedestal.

6. The thermal base of claim 1, wherein the rib surrounds the first recess and the pedestal.

7. The thermal base of claim 1, wherein the body of thermally conductive material has, in plan view, a rectangular shape.

8. The thermal base of claim 1, wherein the rib has a serpentine shape.

9. A package, comprising:
   a thermal base, including:
      a body of thermally conductive material having a top surface, wherein the top surface of said body includes a pedestal and a rib extending in a same direction;
   an integrated circuit chip mounted to said pedestal, said integrated circuit chip including a bonding pad;
   a leadframe assembly, including:
      a plurality of leads; and
      an encapsulant ring that partially embeds said plurality of leads;
   wherein the leadframe assembly is mounted to the top surface of said body surrounding the pedestal; and
   wherein the pedestal has a thickness that positions the bonding pad at a height substantially coplanar with the plurality of leads.

10. The package of claim 9, further including a bonding wire electrically connecting the pad to one of said plurality of leads.

11. The package of claim 10, wherein the coplanar arrangement of the pad and plurality of leads effectively shortens a length of the bonding wire so as to provide for improved electrical characteristics of frequency response, impedance and inductance.

12. The package of claim 9, further comprising a recess in a top surface of the pedestal, wherein said integrated circuit chip is mounted within the recess, and wherein the thickness of the pedestal and a depth of the recess positions the bonding pad at a height substantially coplanar with the plurality of leads.

13. The package of claim 9, further comprising:
   a recess in a top surface of the pedestal; and
   a plurality of sub-pedestal structures within the recess, wherein said integrated circuit chip is mounted within the recess to a top surface of the plurality of sub-pedestal structures, and wherein the thickness of the pedestal, a depth of the recess and a height of the sub-pedestal structures positions the bonding pad at the height substantially coplanar with the plurality of leads.

14. The package of claim 13, wherein the sub-pedestal structures are arranged in an arrayed pattern.

15. The package of claim 14, wherein the arrayed pattern is a waffle pattern.

16. The package of claim 9, wherein a bottom surface of the encapsulant ring includes a recess sized and shaped to mate with the rib when the leadframe assembly is mounted to the top surface of said body.

17. The package of claim 16, wherein said rib peripherally surrounds the pedestal.

18. The package of claim 17, wherein the rib has a serpentine shape.

19. The package of claim 17, wherein the top surface of said body further includes a further recess that peripherally surrounds the pedestal and is positioned between the pedestal and the rib.

20. The package of claim 9, further including:
 a bonding wire electrically connecting the pad to one of said plurality of leads; and
 a cover mounted to a top surface of the encapsulant ring to define a sealed open region through which the bonding wire extends.

* * * * *